(12) United States Patent
Mukherjee et al.

(10) Patent No.: US 12,712,111 B2
(45) Date of Patent: Aug. 18, 2026

(54) PLANAR TRANSFORMERS WITH INTERLEAVED WINDINGS AND HIGH VOLTAGE ISOLATION

(71) Applicant: The Regents of the University of Colorado, a body corporate, Denver, CO (US)

(72) Inventors: Satyaki Mukherjee, Boulder, CO (US); Branko Majmunovic, Boulder, CO (US); Dragan Maksimovic, Boulder, CO (US); Brian B. Johnson, Seattle, WA (US)

(73) Assignees: The Regents of the University of Colorado, a body corporate, Denver, CO (US); University of Washington, Seattle, WA (US)

( * ) Notice: Subject to any disclaimer, the term of this patent is extended or adjusted under 35 U.S.C. 154(b) by 1019 days.

(21) Appl. No.: 17/839,924

(22) Filed: Jun. 14, 2022

(65) Prior Publication Data

US 2022/0399153 A1 Dec. 15, 2022

Related U.S. Application Data

(60) Provisional application No. 63/210,331, filed on Jun. 14, 2021.

(51) Int. Cl.
*H01F 27/28* (2006.01)
*H01F 27/24* (2006.01)
(Continued)

(52) U.S. Cl.
CPC ......... *H01F 27/2804* (2013.01); *H01F 27/24* (2013.01); *H01F 41/041* (2013.01);
(Continued)

(58) Field of Classification Search
CPC .... H01F 27/2804; H01F 27/24; H01F 41/041; H01F 2027/2809; H01F 2027/2819;
(Continued)

(56) References Cited

U.S. PATENT DOCUMENTS 6,927,661 B2 * 8/2005 He ...................... H01F 27/2804 336/200
8,648,687 B2 * 2/2014 Li ........................... H01F 27/06 336/200
2008/0231403 A1 * 9/2008 Hsu ..................... H01F 27/2804 336/200
2010/0020448 A1 * 1/2010 Ng ...................... H03F 3/45192 336/200

(Continued)

*Primary Examiner* — Mang Tin Bik Lian

(57) ABSTRACT

Various embodiments of the present disclosure relate to power conversion using a planar transformer assembly that provides medium-voltage isolation at high frequencies. A planar transformer comprises primary and secondary planar windings configured to generate an isolated output. Each primary and secondary winding is interleaved on layers of a printed circuit board using one or more vias within the layers of the printed circuit board. The planar transformer also comprises a magnetic core and a field-shaping apparatus coupled with the printed circuit board. The field-shaping apparatus is configured to shape an electric field generated by the windings. The primary windings can be coupled to a DC source via switching devices while the secondary windings can be coupled via switching devices to one or more DC ports followed by AC inverters configured to generate three single-phase AC outputs for medium voltage applications.

20 Claims, 14 Drawing Sheets

(51) Int. Cl.
*H01F 41/04* (2006.01)
*H02M 5/458* (2006.01)
*H05K 1/11* (2006.01)

(52) U.S. Cl.
CPC .......... *H02M 5/4585* (2013.01); *H05K 1/115* (2013.01); *H01F 2027/2809* (2013.01)

(58) Field of Classification Search
CPC .... H01F 27/2885; H01F 27/36; H01F 27/363; H01F 2017/008; H01F 27/288; H02M 5/4585; H02M 1/0058; H02M 1/0064; H02M 1/007; H02M 3/33584; H02M 7/5387; H02M 3/003; H02M 3/33573; H02M 7/003; H02M 7/4807; H05K 1/115; H05K 1/165
See application file for complete search history.

(56) References Cited

U.S. PATENT DOCUMENTS

| | | | | |
|---|---|---|---|---|
| 2010/0079229 | A1* | 4/2010 | Koprivnak | H01F 27/29 336/200 |
| 2013/0207767 | A1* | 8/2013 | Worthington | H01F 27/363 336/84 C |
| 2015/0179334 | A1* | 6/2015 | Jeong | H05K 1/165 361/782 |
| 2018/0040410 | A1* | 2/2018 | Hamada | H05K 1/0262 |
| 2018/0342349 | A1* | 11/2018 | Mao | H01F 27/363 |
| 2019/0081389 | A1* | 3/2019 | Tsai | H01Q 1/243 |
| 2019/0110355 | A1* | 4/2019 | Sato | H05K 7/20509 |
| 2020/0258675 | A1* | 8/2020 | Jimenez Pino | H01F 27/306 |
| 2022/0037074 | A1* | 2/2022 | Tashiro | H02M 3/33576 |
| 2022/0045628 | A1* | 2/2022 | Chen | H02J 7/0016 |

* cited by examiner

710

PLANAR TRANSFORMERS WITH INTERLEAVED WINDINGS AND HIGH VOLTAGE ISOLATION

RELATED APPLICATIONS

This application claims the benefit priority to U.S. Provisional Application No. 63/210,331, filed on Jun. 14, 2021, and entitled "Planar Transformers With Interleaved Windings and High Voltage Isolation" and which is hereby incorporated by reference in its entirety.

STATEMENT REGARDING FEDERALLY FUNDED RESEARCH

This invention was made with government support under grant number DE-EE0008346 awarded by the U.S. Department of Energy. The government has certain rights in the invention.

TECHNICAL FIELD

Various embodiments of the present technology relate to direct current (DC) and alternating current (AC) power conversion using planar transformers and systems, methods, and devices for providing medium voltage isolation at high frequencies.

BACKGROUND

DC-to-AC or AC-to-DC power conversion is required in many power and energy systems connected to the AC power grid. Such systems include renewable energy system such as photovoltaic (PV) plants where power is converted from DC to AC, as well as systems where power is converted from AC to DC to power electric vehicle chargers, data centers and other information technology system, or industrial processes. Furthermore, bidirectional power conversion from AC to DC and from DC-to-AC is required in battery energy storage systems tied to the AC power grid. In power conversion systems operating at higher power levels, the DC voltage may be in the order of several hundreds of volts to kilovolts, while the AC grid voltage is preferably at higher medium-voltage levels, from several kilovolts to tends of kilovolts. The DC-to-AC or AC-to-DC power conversion system must therefore meet the required step-up or step-down voltage requirements, together with providing for the adequate voltage isolation between DC and AC side. In typical systems, these requirements are met using line frequency transformers operating at grid AC frequency of 50 Hz or 60 Hz.

For example, in standard photovoltaic (PV) systems a line frequency transformer is used to step-up the output voltage from the converted solar energy. Typical PV grid applications output insufficient voltage; thus, a line frequency transformer must be inserted into the system to provide the power to the AC grid. While useful in their application, line frequency transformers have their share of tropes. First the actual design of such a system is bulky in nature and requires a copious amount of iron and copper to build the structure. This design results in an increased volume, weight, and cost to systems which include these types of line transformers. So, although line frequency transformers may be suitable in increasing the output voltage of a system, while providing voltage isolation, these other factors diminish the applicability of these transformers in practice.

OVERVIEW

A planar transformer assembly and architecture is disclosed herein that provides voltage isolation for high-frequency applications. A planar transformer assembly comprises primary and secondary planar windings coupled with switching devices to generate an isolated output. Each primary and secondary winding is interleaved on layers of a printed circuit board using one or more vias providing electrical connections within the layers of the printed circuit board. The planar transformer also comprises a magnetic core and a field-shaping apparatus coupled with the printed circuit board. The field-shaping apparatus is configured to shape an electric field of the isolated output generated by the windings. The primary windings can be coupled to a DC source via switching devices while the secondary windings can be coupled to one or more DC ports via switching devices followed by AC inverters configured to generate stackable three single-phase AC outputs to meet requirements in medium-voltage applications.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

While multiple embodiments are disclosed, still other embodiments of the present technology will become apparent to those skilled in the art from the following detailed description, which shows and describes illustrative embodiments of the invention. As will be realized, the technology is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

Figure 1A:
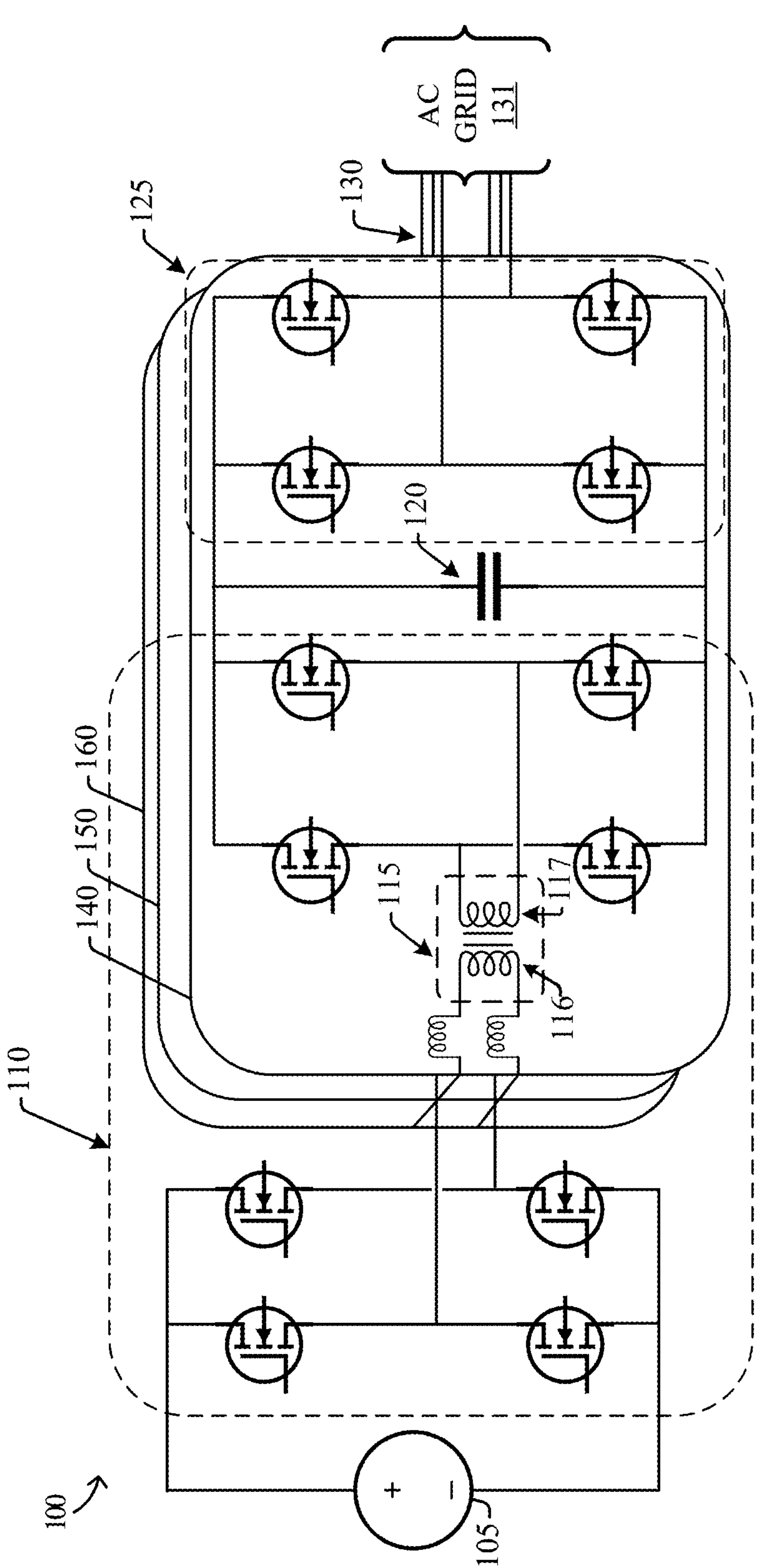
FIG. 1A illustrates an exemplary operating architecture that demonstrates a power conversion module that employs a planar transformer in an implementation.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present disclosure relate to DC-to-AC, AC-to-DC, AC-to-AC or DC-to-DC power conversion using a planar transformer assembly that provides medium-voltage isolation with reduced losses at high frequencies, and high levels of voltage isolation between primary and secondary windings. A planar transformer comprises primary and secondary planar windings coupled with switching devices to generate an isolated DC output. Each primary and secondary winding is interleaved on layers of a printed circuit board using one or more vias within the layers of the printed circuit board. The planar transformer also comprises a magnetic core and a field-shaping apparatus coupled with the printed circuit board. The field-shaping apparatus is configured to shape an electric field of the isolated output generated by the windings. The primary windings can be coupled to a DC source via switching devices while the secondary windings can be coupled to one or more DC ports via switching devices and followed by AC inverters configured to generate three single-phase AC outputs for medium voltage applications. The primary and secondary windings can be coupled via switching devices to DC or AC sources or loads in different DC-to-AC, AC-to-DC, AC-to-AC or DC-DC power conversion applications. The information below provides an introduction to a selection of concepts in a simplified form that are further described in Appendices A, B, C, and D, attached hereto.

In an embodiment, a DC-to-AC converter module is provided using planar transformer assemblies. The DC-to-AC converter module comprises one or more DC ports fed by a DC source, one or more quadruple active bridge converters comprising switching devices and coupled with the one or more DC ports, wherein each quadruple active bridge converter of the one or more quadruple active bridge converters comprises a planar transformer assembly configured to generate an isolated DC output based on the DC source, and three or more AC inverters, wherein each AC inverter of the three or more AC inverters is coupled with each quadruple active bridge converter of the one or more quadruple active bridge converters and is configured to generate three single-phase AC outputs at different phases with respect to each other based on the isolated DC output.

In another embodiment, a system is provided using the technology disclosed herein.

The presented invention eliminates the problems of the line frequency transformer while preforming the required functions when embedded within high-frequency switched-mode power converters. The planar design significantly reduces both the bulkiness and production costs of the transformer. When implemented into system design, these reductions result in both the reduced weight as well as the increased practicality of the entire system. While improving upon the downfalls of the line frequency transformer, the design of the presented invention also includes further integrations which improve the overall efficiency of the system. The planar transformer further includes a magnetic core and planar windings with a field shaping apparatus allowing the planar transformer to shape the electric field of the isolated output that is generated by these interleaved windings. These integrations give more control to the user while improving system.

Advantageously, the disclosed modular architecture and planar transformer design enables flexible and efficient power conversion suitable for renewable energy integration to the medium voltage grid, among other benefits. The planar transformer includes interleaved primary and secondary windings separated by at least a high-voltage dielectric capable of maintaining isolation between each layer and winding. Interleaving of the primary and secondaries are essential for efficient high frequency operation of the transformer. Further, spacing design of internal and layer-level components (i.e., windings, vias, magnetic core) reduces electric field effects and breakdown, allowing the planar transformer to function at high voltages. As a result, the planar transformer can be used in at least modular DC-to-AC architectures in place of bulky line frequency transformers to provide three single-phase AC outputs at medium to high voltages.

Figure 1B:
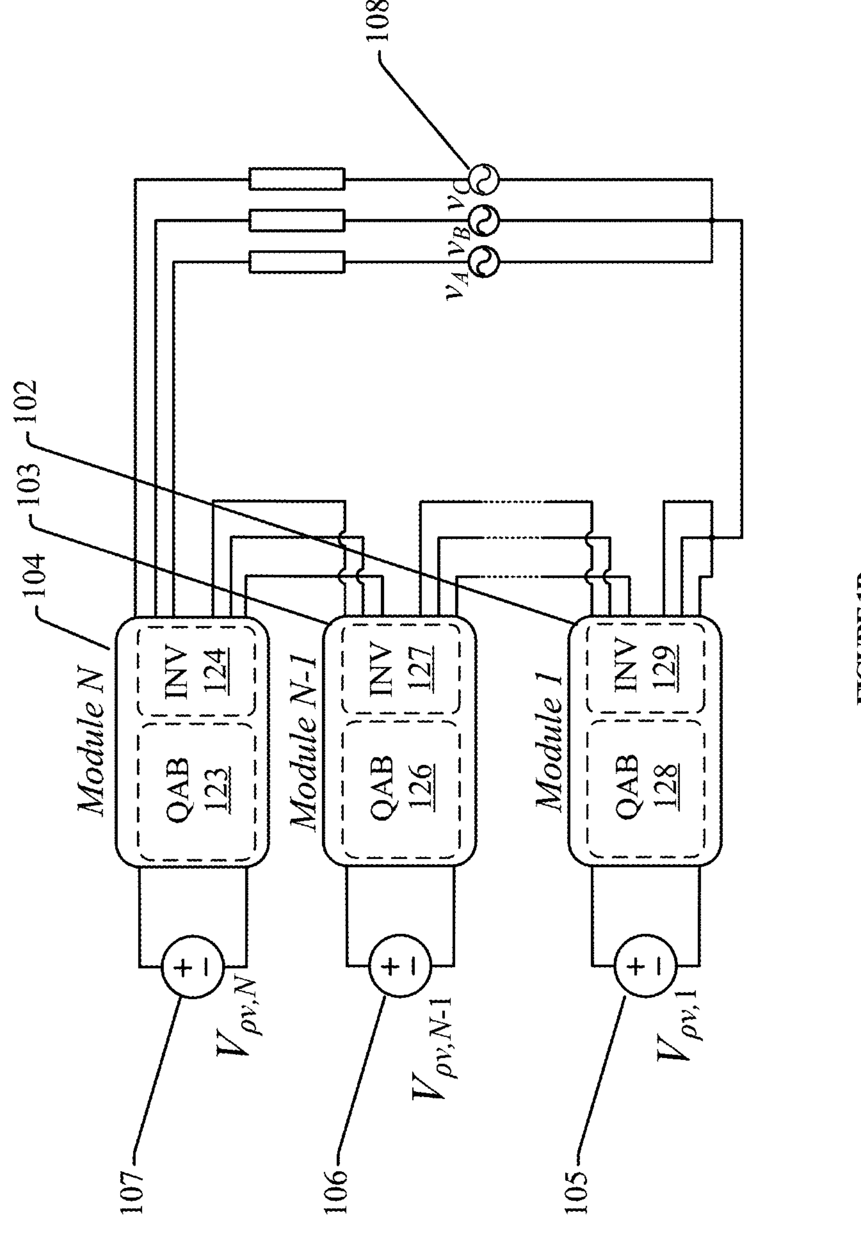
FIG. 1B illustrate an exemplary operating architecture that demonstrates how power conversion modules shown in FIG. 1A can be connected to interface one or more DC voltages to a medium-voltage AC grid.

Turning to the Figures, FIGS. 1A and 1B illustrate exemplary operating architectures that demonstrates a power conversion assembly that can be utilized in an implementation. FIG. 1A includes operating converter module 100 which describes a unit power converter (i.e., DC-to-AC) module, which can be connected in series to interface DC inputs to a medium-voltage AC grid 131 without bulky line-frequency transformers. Operating converter module 100 includes DC input 105, quadruple active bridge (QAB) 110, each comprising transformer 115, DC output 120, inverter 125, and AC output 130. Operating converter module 100 provides an assembly using a QAB architecture wherein a DC source is connected in parallel with three stages (i.e., stage 140, 150, and 160) to generate three single-phase AC outputs. In other embodiments, operating converter module 100 can be connected in series and/or parallel to generate another output.

In operation, DC input 105 can be supplied from a DC power source, such as a photovoltaic (PV) string or the like. DC power is then provided to one or more of QAB 110. Each of QAB 110 can comprise switching devices, transistors (i.e., MOSFETs), inductors, transformers, and other electronic components configured to perform voltage isolation and generate isolated copies of DC input 105, like a DC bus or DC-DC converter that provides a converted DC output 120 to be used by inverters. Each of QAB 110 can comprise a primary switching device coupled with the DC source and operatively coupled to a transformer 115, and a secondary switching device operatively coupled to transformer 115 to receive DC output 120. The DC input 105 and QAB 110 can be connected in series with each module (i.e., module 140, 150 and 160) to generate the different single-phase AC outputs 130. The transformer 115 is included on each of module 140, 150 and 160 to generate individual isolated outputs. The transformer 115 can comprise a planar transformer with primary windings 116 and secondary windings 117 interleaved on a printed circuit board to allow for medium-voltage isolation at high frequencies to convert DC input 105 to DC output 120. In some embodiments, transformer 115 further comprises an air-gap to reduce magnetizing inductance to ensure soft switching over the entire line cycle and reduce switching losses.

FIG. 1B shows an exemplary power conversion architecture 101 comprising exemplary power modules 102, 103, 104, wherein each module can be implemented as module 100 shown in FIG. 1A. In this exemplary architecture 101, one or multitude of DC voltages 105, 106, 107, serve the purpose of DC voltage 105 in FIG. 1A. Three converter module AC outputs 130 are each stacked in series to interface to the three-phase AC grid voltage 108.

This form of power conversion provided by the operating power converter module 100 eliminates the need of bulky line frequency transformer by utilizing a high frequency planar transformer like transformer 115. In this stacked architecture using multiple modules with individual transformers, the peak of the AC line voltage gets impressed across the primary windings 116 and secondary windings 117 of the high frequency transformer. To achieve increasing power density, a low profile planar PCB is used. To reduce the AC winding losses, interleaving needs to be done between the primary and secondary layers of the high frequency transformer. Within the PCB, primary windings 116 and secondary windings 117 travel through vias located throughout the PCB layers.

Following each transformer 115, an inverter 125 is provided on each of stages 140, 150, and 160 to invert each DC output, such as DC output 120 of module 140, to AC (other DC outputs of modules 150 and 160 not shown). Each of inverter 125 can be designed as an H-bridge inverter comprising a number of transistors, such as MOSFETs. In other embodiments, each inverter 125 can comprise other components and/or configurations to provide an AC output 130 from a DC output. AC output 130 includes three single-phase AC outputs wherein each single-phase output has a different phase with respect to each other. AC output 130 can then be stacked as part of an interface to medium-voltage grid for various uses as shown in FIG. 1B.

It may be appreciated that the power converter assembly of operating architecture 100 can utilize additional or fewer stages (i.e., stage 140, stage 150, and stage 160) coupled in series or in parallel with DC input 105. Additionally, another type of converter can be used in place or in combination with each of QAB 110. Also, multiple power converter assemblies (i.e., using the entire schematic of operating converter module 100) can be utilized in series and/or parallel in various applications to generate an AC output per system requirements. It may also be appreciated that operating architecture can be utilized for other types of power conversion, such as DC-to-DC, AC-to-DC, and/or AC-to-AC.

FIG. 1B illustrates operating architecture 101 that demonstrates a system using multiple power conversion modules that can be utilized in an implementation. Operating architecture 101 demonstrates a cascaded architecture using multiple converter modules coupled with DC sources to generate a synchronized three-phase AC output. Operating architecture 101 includes module 102, 103, and 104, DC input 105, 106, and 107, and AC output 108. For example, each module 102, 103, and 104 of operating architecture 101 can include the same, different, or some combination of components as illustrated in operating converter module 100 of FIG. 1A.

In operation, each module 102, 103, and 104 receives DC power from DC input 105, 106, and 107, respectively. Each module respectively includes QAB 123, 126, and 128 coupled with one or more transformers and three-phase inverters 124, 127, and 129. Each module is configured to provide DC-to-DC conversion (among other types of power conversion) and isolation at high frequencies. As a result, each module can output three-phase AC or another isolated output. In various embodiments, modules 102, 103, and 104 can be coupled in series wherein module 102 can provide its three-phase AC output to module 103, and module 103 can provide its three-phase AC output to module 104. Then, module 104 can provide a synchronized three-phase AC output 108 downstream to a load, such as a grid. In some embodiments, each module 102, 103, and 104 can comprise a controller and/or timing reference unit configured to synchronize the AC phases, among other functions.

Figure 2:
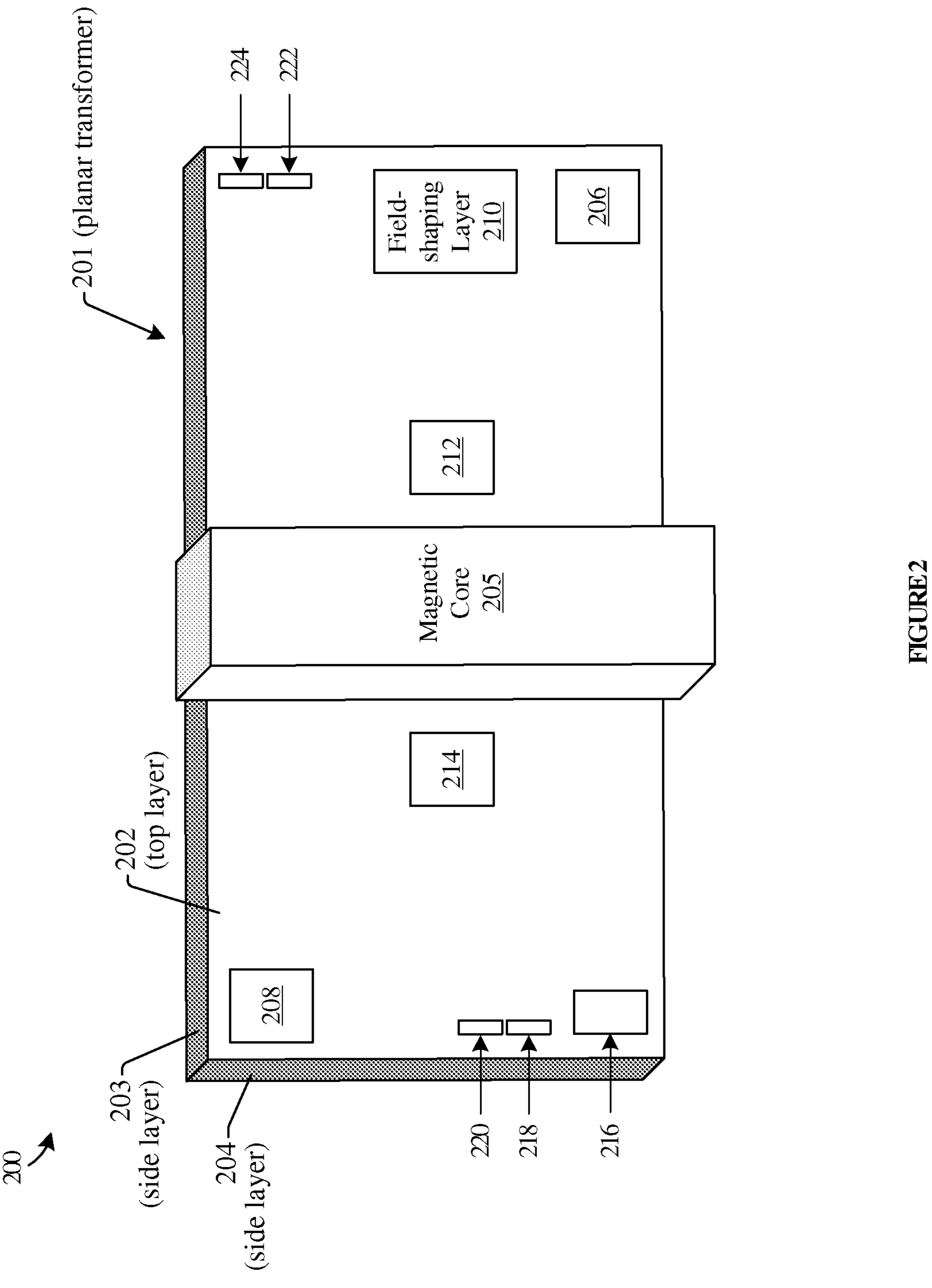
FIG. 2 illustrates an exemplary transformer assembly in accordance with some embodiments of the present disclosure.

FIG. 2 illustrates an exemplary transformer assembly in accordance with some embodiments of the present disclosure. FIG. 2 includes assembly architecture 200, which demonstrates an external view of a planar transformer that may be used in various embodiments for power conversion applications. Assembly architecture 200 includes planar transformer 201, magnetic core 205, primary port 206, secondary port 208, field-shaping layer 210, and vias 212, 214, 216, 218, 220, 222, and 224 (hereinafter referred to collectively as plurality of vias). For example, assembly architecture 200 can be utilized in transformer 115 of FIG. 1A.

In various embodiments, planar transformer 201 is used in a quadruple active bridge circuit functioning as a DC-DC converter to provide medium voltage (i.e. multiple kV) isolation at high frequencies (i.e., 200 kHz). Planar transformer 201 can comprise both primary windings and secondary windings (not pictured) wherein each winding is located on different layers of a printed circuit board (PCB). The primary and secondary windings of planar transformer 201 can be interleaved through various vias located throughout the PCB. Dielectric layers can be included between each primary and secondary winding to maintain isolation between the layers. The dielectric layer can be formed using, for example, polyimide dielectric, such as Panasonic Felios RF775, and/or Kapton dielectric, among others. In some instances, a layer of FR4 can separate each winding layer and a polyimide dielectric layer for additional isolation. Overall, the PCB of planar transformer 201 can have multiple layers to provide a number of primary and secondary windings. In some embodiments, each layer can be 6 mm thick, however, the thickness and number of layers can vary from embodiment to embodiment.

The PCB of planar transformer 201 further includes a top layer 202, internal layers 203 and 204, and a bottom layer (not shown). Neither top layer 202 nor the bottom layer include any PCB traces or transformer windings, however, each layer, including internal layers 203 and 204 can be treated to further enhance isolation capabilities, reduce a potential for electric field breakdown, and increase voltage limits usable with planar transformer 201. Top layer 202 and the bottom layer may also include one or more of field-shaping layer 210, which may be formed with copper to provide similar benefits and enhanced performance. Field-shaping layer 210 may be placed a distance from magnetic core 205, the plurality of vias, and the internal windings. Additionally, field-shaping layer 210 can satisfy manufacturing requirements of a PCB, among other benefits.

Magnetic core 205 can be affixed to top layer 202, wrap around the PCB or windings within the PCB, or be coupled to the PCB in some other configuration. Magnetic core 205 is a conductive device and can be kept at a known potential with respect to the potential of planar transformer 201 or some external potential. In various embodiments, magnetic core 205 is designed to remain at a ground potential. Magnetic core 205 can be made of a ferromagnetic material, such as ferrite, or it can be made of some other metal and/or alloy.

Each via of the plurality of vias (i.e., 212, 214, 216, 218, 220, 222, and 224) can be located on top layer 202, bottom layer, internal to the PCB (i.e., buried vias), or some combination thereof and have one or more inputs to provide access to the connection paths of the vias. The location of each via can be selected based on a spacing between the via and magnetic core 205, the internal windings, and/or both to maintain horizontal voltage isolation. The plurality of vias can be used to interleave each primary and secondary winding of planar transformer 201. Further the plurality of vias can have inputs or ports to connect a power source or other circuitry to planar transformer 201. For example, primary port 206 and secondary port 208 can each include one or more vias with inputs or other couplings to connect one or more wires to primary and secondary windings of planar transformer 201, respectively.

Figure 3:
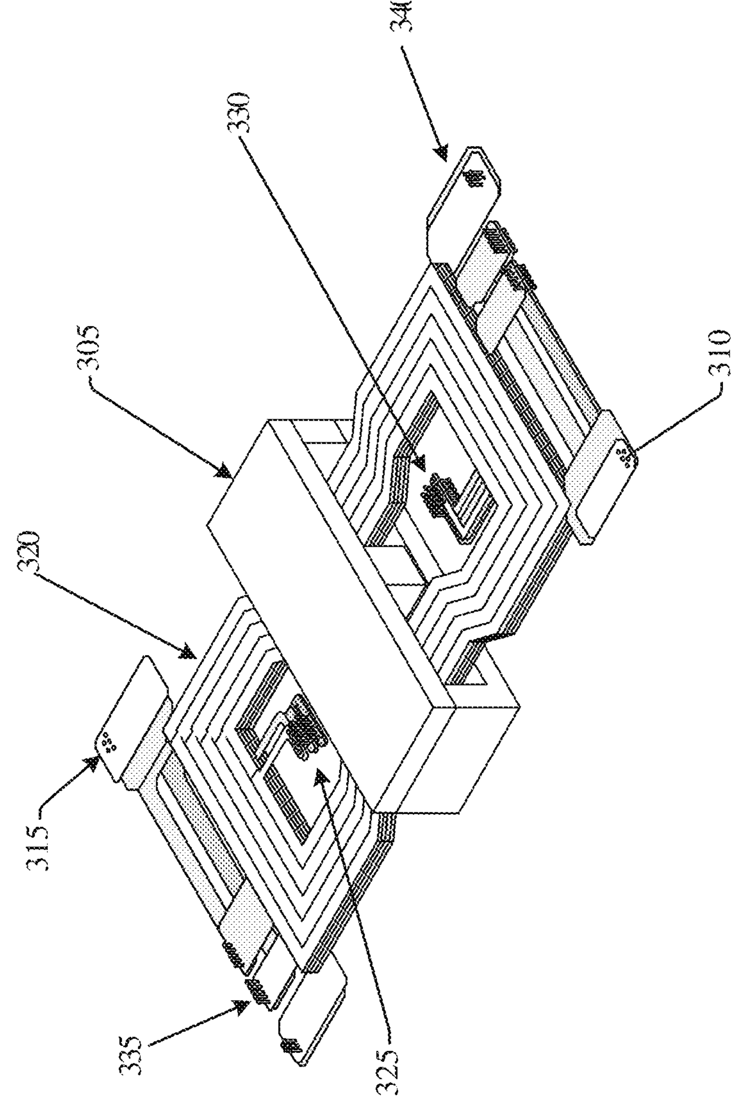
FIG. 3 illustrates an internal aspect of a transformer assembly in accordance with some embodiments of the present disclosure.
Figure 3:

FIG. 3 illustrates an internal aspect of a transformer assembly in accordance with some embodiments of the present disclosure. Figure includes transformer architecture 300 which shows internal elements of a planar transformer that can be used in DC-to-AC conversion applications among other types of power conversion applications. For example, transformer architecture 300 can be utilized in transformer 115 of FIG. 1A and/or planar transformer 201 of FIG. 2. Transformer architecture 300 includes magnetic core 305, primary port 310, secondary port 315, windings 320, and vias 325, 330, 335, and 340.

Windings 320 are formed using conductive traces on several different layers of a PCB to produce an isolated output. Windings 320 comprise both primary and secondary windings with each winding on its own layer of a PCB. Each primary and secondary winding can be connected from one layer to another using one or more vias on the PCB, such as vias 325, 330, 335, and/or 340. For example, a first primary winding placed on the second layer of the PCB can be connected to a second primary winding placed on the fourth layer through via 325 and/or 330. Likewise, a first secondary winding placed on the third layer of the PCB can be connected to a second secondary winding placed on the fifth layer of the PCB through via 325 and/or 330. In this exemplary configuration, the windings 320 are interleaved throughout the PCB layers. It may be appreciated that windings 320 can be designed in another configuration. Further each via of the plurality of vias may be placed in different locations, buried in the PCB layers, or some combination thereof.

To provide power to the planar transformer, the PCB comprises primary port 310 and secondary port 315 to allow a wired connection to the windings 320. Both ports can be a via, an input port, or other coupling apparatus. Primary port 310 provides a connection to the primary windings of windings 320 while secondary port 315 provides a connection to the secondary windings of windings 320. To enhance the magnetic field and performance of the planar transformer when powered via primary port 310 and secondary port 315, magnetic core 305 is provided. Magnetic core 305 can be made of a ferromagnetic material, such as ferrite, and/or some other metal alloy. Magnetic core 305 can be designed to form around parts of windings 320 to reduce losses.

This paragraph describes an exemplary planar transformer using transformer architecture 300. A high frequency transformer can be utilized in switched-mode power converters well suited for direct interface to a medium-voltage (MV) AC grid. For example, a planar transformer can be utilized in a stacked inverter architecture for renewable energy integration to the AC grid. The transformer can be developed using planar magnetics technology for the ease of manufacturing and is intended for medium voltage application. To maximize the efficiency of the power conversion, transformer primary and secondary windings are interleaved. The primary and secondary layer of the transformer have 4 T/L for the primary layer, 8 T/L for the secondary layer, a width of primary turns of 8.56 mm, a width of secondary turns of 4.18 mm, spacing between 2 turns of 0.2 mm (can withstand 600 volts), and spacing from magnetic core 305 of 0.2 mm (Kapton-tape should be wrapped around the PCB). All vias are 10 mm away from the windings (d=3 kv/mm rule). Excitations on transformer architecture 300 using the aforementioned design provide 1000 Volts across 6 layers with 170 volts across each layer. Excitations on transformer architecture 300 using 2000 Volts across 6 layers provide 340 volts across each layer. Thus, the exemplary planar transformer can be utilized for 30 kV applications, while the voltage differential between primary and secondary windings can be as high as 30 kV.

Figure 4A:
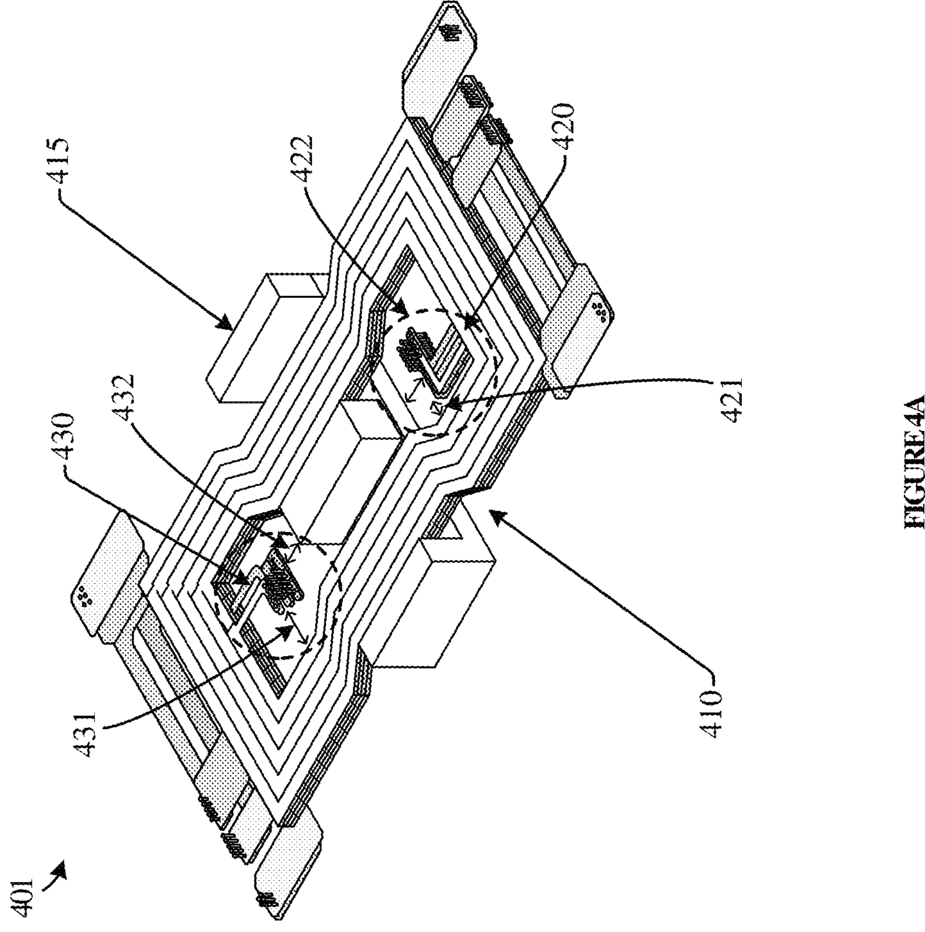
FIGS. 4A, 4B, and 4C illustrate aspects of internal transformer assembly and component spacing test results in accordance with some embodiments of the present disclosure.
Figure 4B:
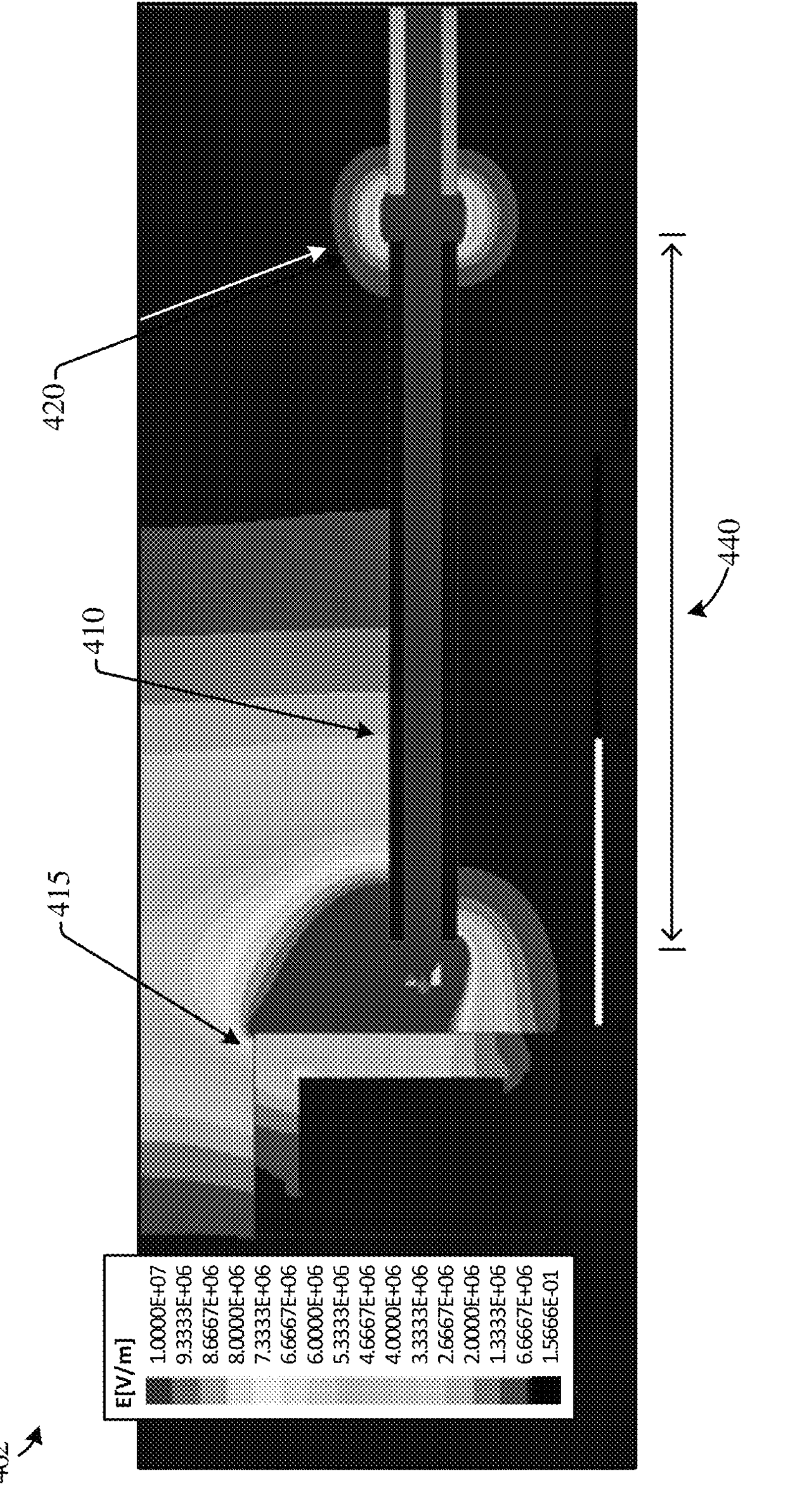
Figure 4C:
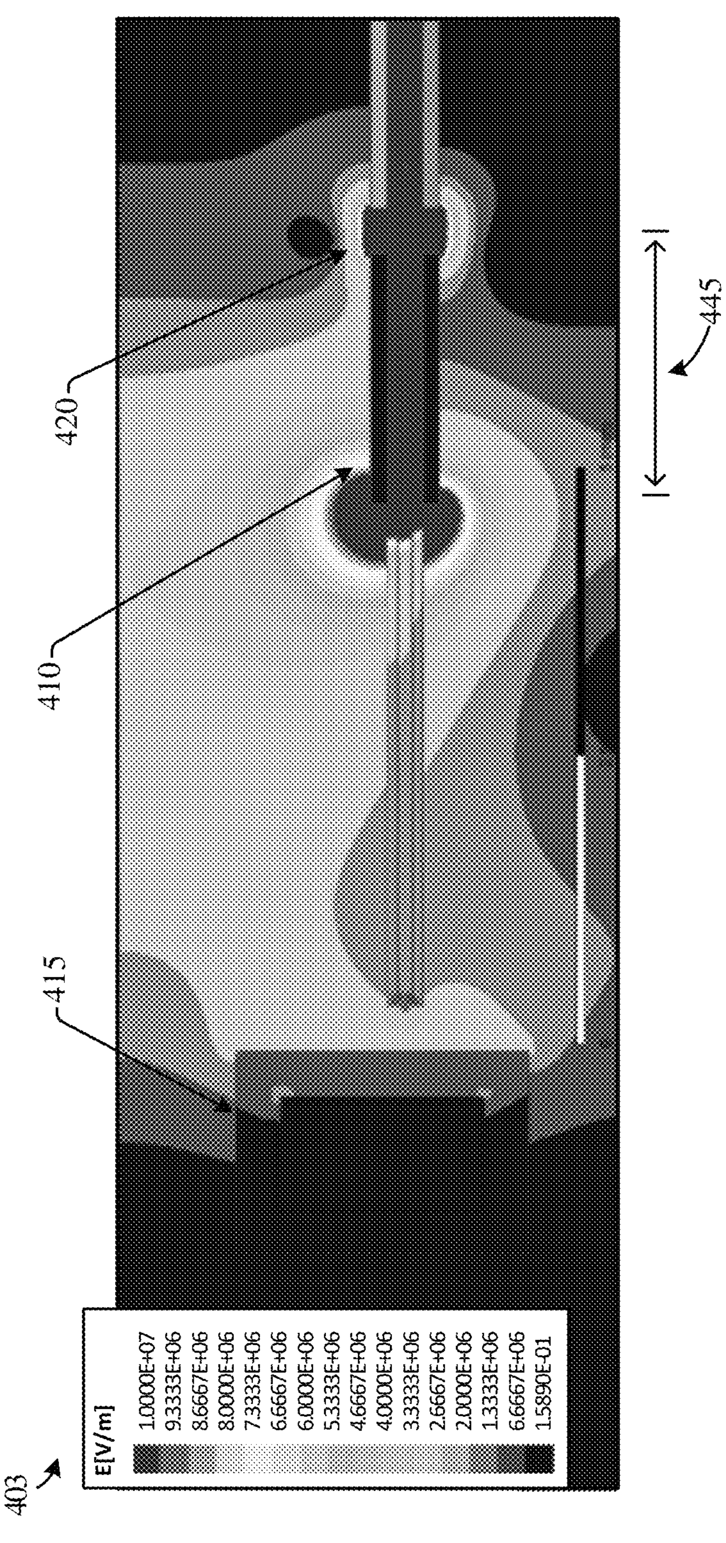

FIGS. 4A, 4B, and 4C illustrate aspects of a transformer assembly and component spacing test results in accordance with some embodiments of the present disclosure. FIGS. 4A, 4B, and 4C include transformer architecture 401, planar aspect 402, and planar aspect 403. Transformer architecture 401 demonstrates a view of internal components of a planar transformer including windings 410, magnetic core 415, vias 420 and 430, and planar spacings 421, 422, 431, and 432. Planar aspect 402 includes windings 410, magnetic core 415, via 420, and spacing 440. Planar aspect 403 includes windings 410, magnetic core 415, via 420, and spacing 445.

Windings 410 comprise conductive traces on several different layers of a PCB to produce an isolated output. Windings 410 have both primary and secondary windings with each winding placed on its own layer of a PCB. Each primary winding can be connected from one layer to another using one or more vias located on or within the PCB, such as vias 420 and 430.

Both windings 410 and magnetic core 415, a grounded, ferrite-based core, generate an electric field when current flows through windings 410. To reduce the effect of fringing electric fields, critical spacing points, such as planar spacing 421, 422, 431, and 432 must be maintained at certain distances to maintain isolation capabilities. Planar spacing 421 is the distance between via 420 and windings 410; planar spacing 422 is the distance between via 420 and magnetic core 415; planar spacing 431 is the distance between via 430 and windings 410; and planar spacing 432 is the distance between via 430 and magnetic core 415. Each distance can range from 0.1 mm to 10 mm, among other spacings to provide varying electrical field effects.

For example, planar aspects 402 and 403 demonstrate electric field effects on a planar transformer based on different spacing designs, such as spacing 440 and spacing 445, respectively. Planar aspect 402 illustrates a spacing 440 of 1.2 mm wherein strong electric fields reside between the windings 410 and magnetic core 415. Planar aspect 403 illustrates a spacing 445 of 5.2 mm, which reduces the electric fields between the windings 410 and magnetic core 415. As the spacing increases, isolation capabilities may increase as electric fields decrease in strength, thus, resulting in increased DC winding resistance, among other aspects. It may be appreciated that isolation requirements can also be met using layers of Kapton as a dielectric apart from or in combination with farther spacing between windings, vias, and the magnetic core. Further, to avoid arcing from high voltage winding to the magnetic core, the magnetic core can be encapsulated with an epoxy material with a high breakdown voltage.

Figure 5:
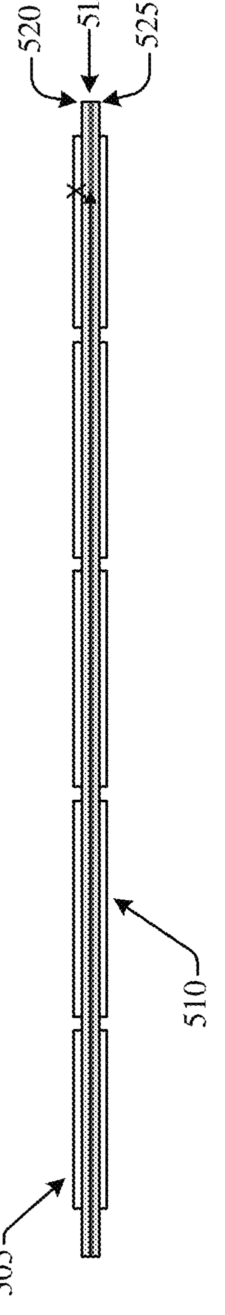
FIG. 5 illustrates exemplary transformer windings and dielectric layering in accordance with some embodiments of the present disclosure.

FIG. 5 illustrates exemplary transformer windings and dielectric layering in accordance with some embodiments of the present disclosure. FIG. 5 includes layer 500 demonstrating a PCB layer design of a planar transformer. Layer 500 further includes primary winding 505, secondary winding 510, high-voltage dielectric 515, and dielectric layers 520 and 525. For example, layer 500 can be used in transformer 115 of FIG. 1A, planar transformer 201 of FIG. 2, and/or transformer architecture 300 of FIG. 3.

A planar transformer employing the design of layer 500 can use more than one of layer 500 to increase the number of turns in the transformer. For example, each layer 500 can be stacked on top of each other (with additional dielectric layers not pictured) to form an interleaved planar transformer. To maintain a voltage isolation of primary winding 505 and secondary winding 510, among other windings, when operating at a medium or high voltage, high-voltage dielectric 515 is included. High-voltage dielectric 515 can be formed using a dielectric material other than FR4, such as a polyimide material or the like. In various embodiments, dielectric layers 520 and 525 are made of FR4 and provide additional insulation between each winding and high-voltage dielectric 515. In other embodiments, dielectric layers 520 and 525 are made of another type of dielectric. Alternatively, dielectric layers 520 and 525 may be removed from layer 500.

Figure 6A:
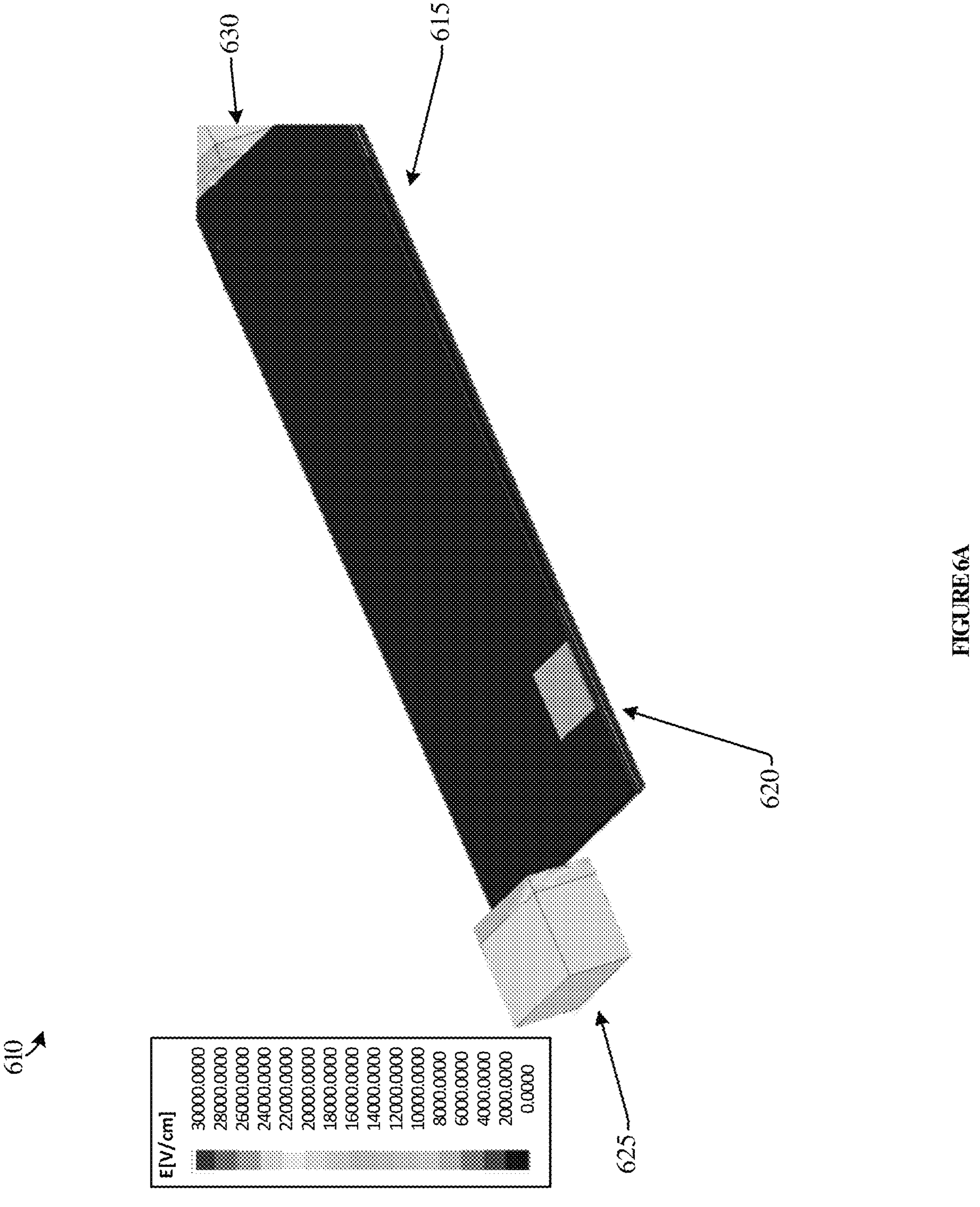
FIGS. 6A and 6B illustrate aspects of exemplary field-shaping components that can be utilized in a transformer assembly in an implementation.
Figure 6B:
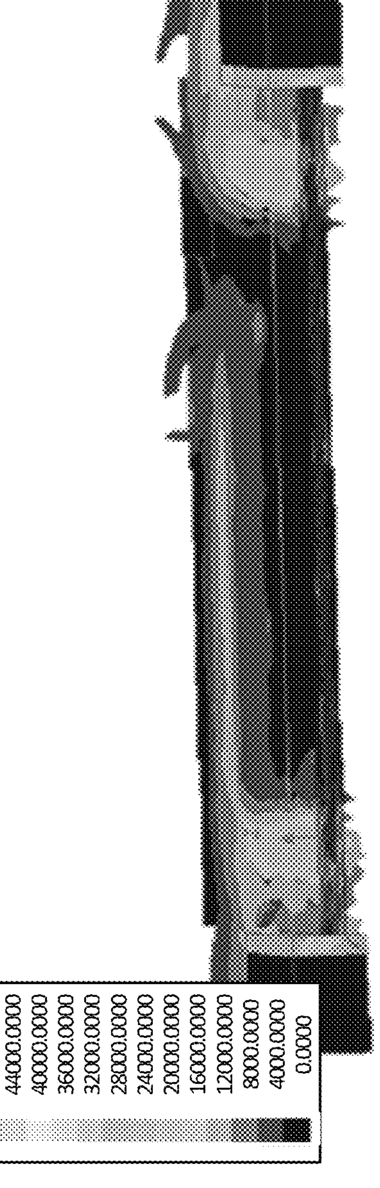
Figure 6B:

FIGS. 6A and 6B illustrate aspects of exemplary field-shaping components that can be utilized in a transformer assembly in an implementation. FIGS. 6A and 6B include environment 610 and environment 620 which illustrate the use and effect of a field-shaping copper layer placed on a top layer of a PCB. Environment 610 further includes PCB layer 615, field-shaping layer 620, and magnetic core segments 625 and 630. For example, environment 610 can be implemented in planar transformer 115 of FIG. 1A and/or planar transformer 201 of FIG. 2.

In a planar transformer design, the top and bottom layers of a PCB may not have any transformer windings embedded. Instead, each top and bottom layer can comprise one or more vias, ports for connecting wires to the transformer, a magnetic core, a field-shaping layer 620, treatment layers, and the like. While working at medium to high voltages, the magnetic core, vias, and transformer windings, among other components, can produce an electric field that affects performance of the planar transformer and its isolation capabilities. To shape the field and reduce impacts of the planar transformer components on external surfaces or vice versa, field-shaping layer 620 is provided. Field-shaping layer 620 can be a copper, or some other element, layer located on the top of PCB layer 615 at some distance from magnetic core segments 625 and 630 and other PCB elements. It may be appreciated that more than one of field-shaping layer 620 can be used throughout the top and bottom layers of PCB. It may also be appreciated that field-shaping layer 620 can be placed beneath or on top of a soldermask layer.

The use of field-shaping layer 620 can provide other benefits in addition to electric field shaping including but not limited to satisfying manufacturing requirements, shaping an electric field near the planar transformer, and providing contacts or ports to connect inputs/outputs to the planar transformer.

Environment 620 demonstrates three-dimensional modeling results of the electric field based on the effects of field-shaping layer 620. For example, the electric field is maintained closely to the design of internal transformer windings, and does not extend beyond PCB layer 615.

Figure 7:
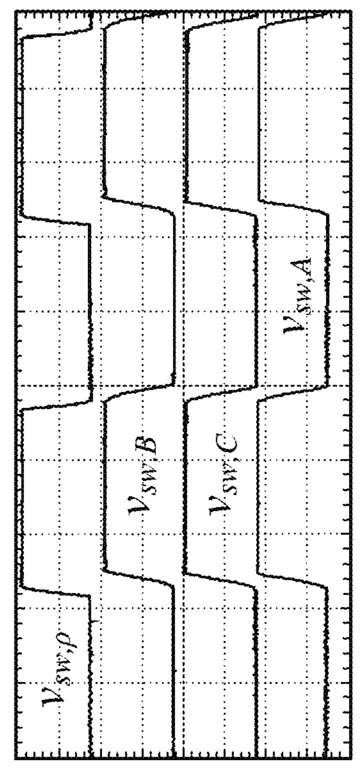
FIG. 7 illustrates exemplary operating voltage and current waveforms using a transformer assembly in a power conversion module in an implementation.
Figure 7:
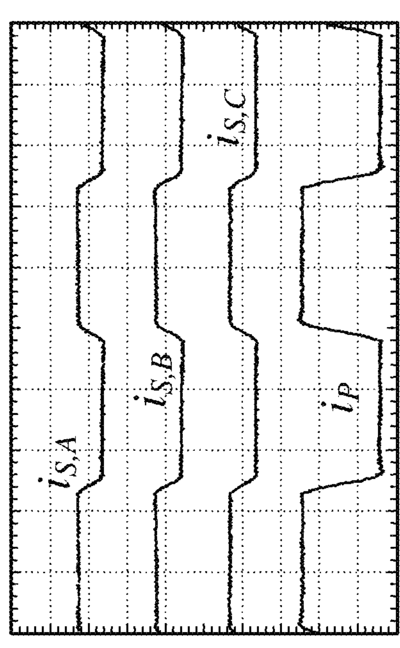
Figure 7:

FIG. 7 illustrates exemplary operating voltage and current waveforms using a transformer assembly in a power conversion module in an implementation. FIG. 7 includes aspects 710 and 720. Aspect 710 illustrates a three-phase AC voltage output. Aspect 720 illustrates a three-phase AC current output. For example, both aspects provide results that may be achievable using the power converter assembly of operating converter module 100 of FIG. 1A.

Aspect 710 demonstrates an AC waveform switching at a high frequency, such as 200 kHz. In other embodiments, AC signals can be generated at a different frequency. Aspect 720 demonstrates an AC current waveform accompanying the voltage waveforms illustrated in aspect 710.

Figure 8A:
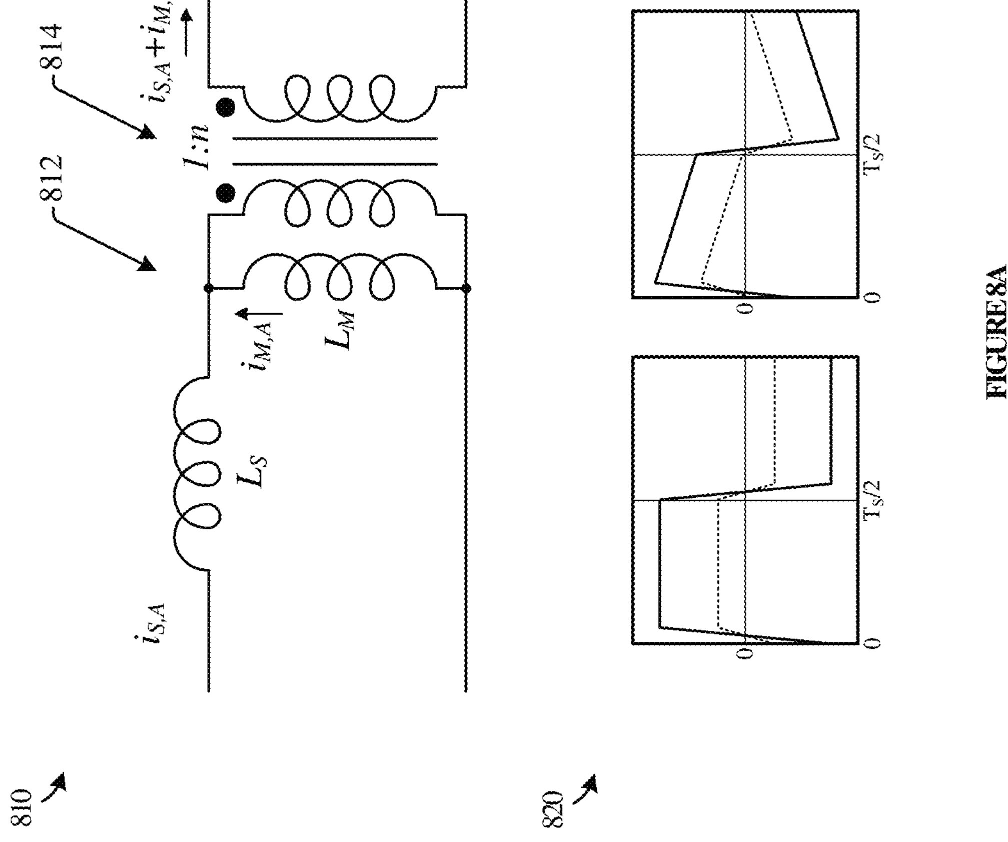
FIGS. 8A, 8B, and 8C illustrate effects of an exemplary air gap component that can be utilized in a transformer assembly in an implementation.
Figure 8B:
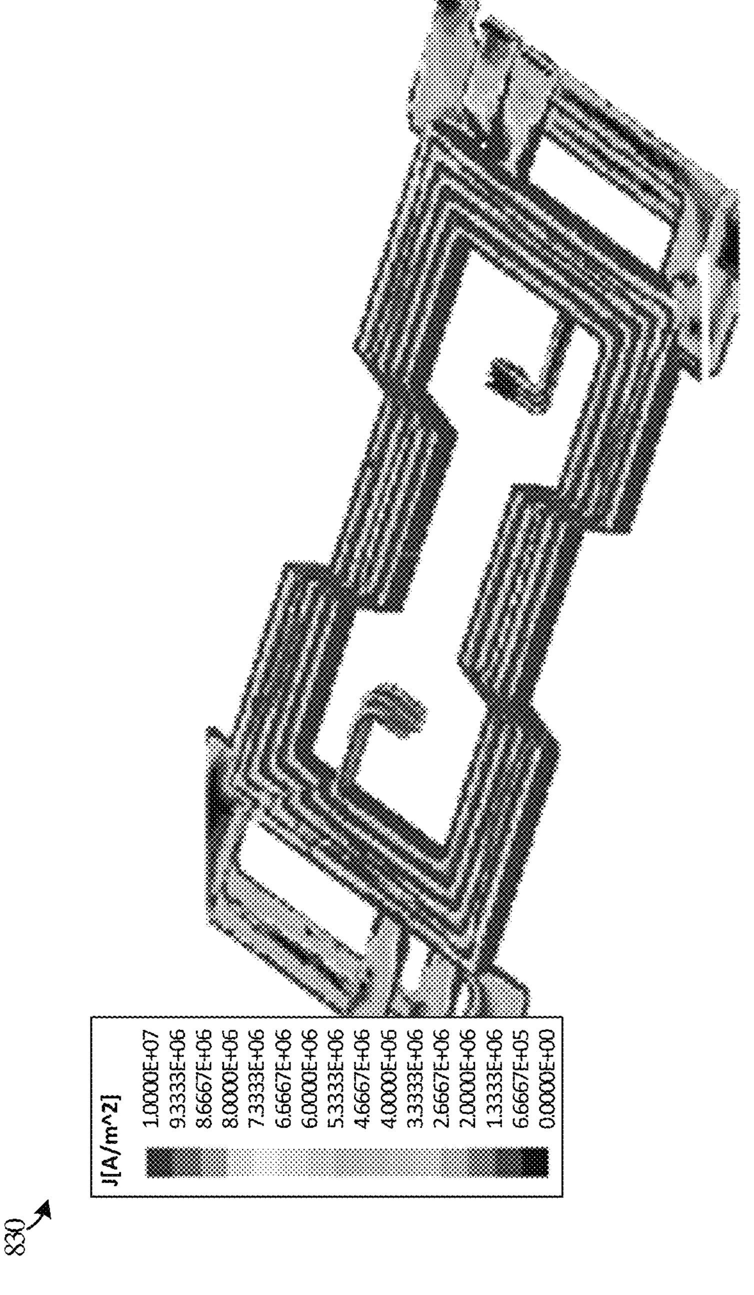
Figure 8C:
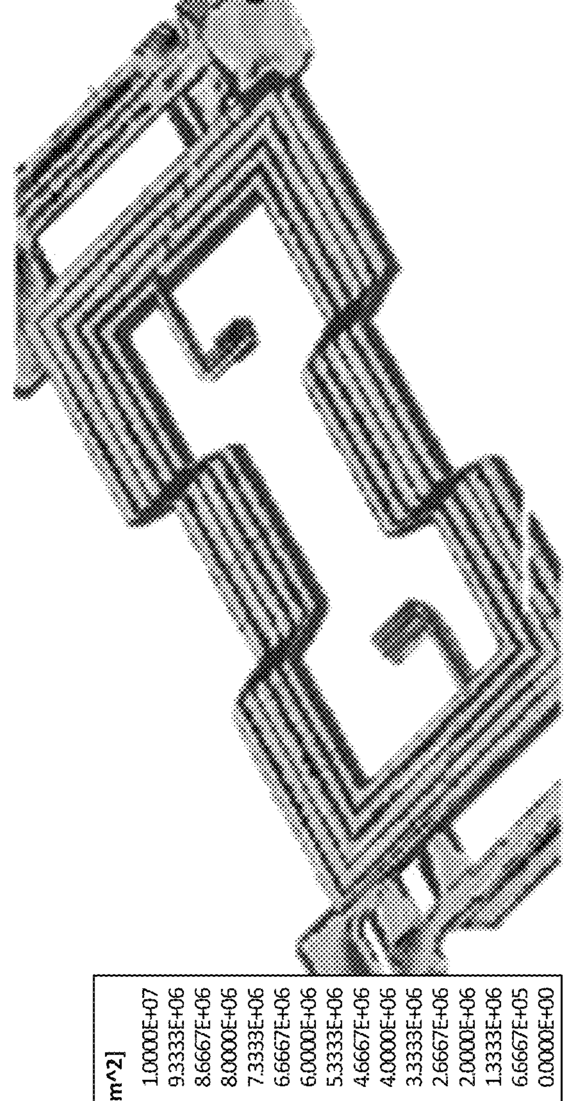

FIGS. 8A, 8B, and 8C illustrate effects of an exemplary air gap component that can be utilized in a transformer assembly in an implementation. FIGS. 8A, 8B, and 8C include aspects 810, 820, 830, and 840. Aspect 810 illustrates a transformer 814 configured to provide medium to high voltage isolation. In the embodiment shown, an air gap is inserted in the magnetic core, resulting in reduced magnetizing inductance 812 coupled with transformer 814. Aspect 820 illustrates sample test results using an assembly with the transformer 810 with an air gap. For example, aspect 810 can be used in a power converter assembly as shown in operating converter module 100 of FIG. 1A. Aspects 830 and 840 illustrate three-dimensional winding element simulations using a transformer with an air gap.

When using an air gap, the magnetizing inductance 812 created by a transformer 810 can be reduced to ensure zero-voltage switching over a line cycle. Switching losses can also be reduced as magnetizing current increases to the point where soft switching is utilized by the assembly.

Aspect 820 demonstrates output waveforms of an assembly employing an air gap as shown in aspect 810. Further results can be seen in aspects 830 and 840. Aspect 830 shows a top layer view of a planar transformer with interleaved primary and secondary windings. Aspect 840 shows a bottom layer view of the planar transformer. Both aspects 830 and 840 demonstrate the effect of using an air gap of aspect 810 on the transformer 810. As shown, imperfect current interleaving results in unequal current density distribution in the top and the bottom layers, which leads to larger proximity losses in the top winding layer. However, transformer 810 can have reduced magnetizing inductance as a result.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having operations, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A planar transformer assembly, comprising:

planar transformer windings configured to at least generate an isolated output, wherein the planar transformer windings comprise one or more primary windings interleaved with one or more secondary windings embedded on layers of a printed circuit board;

one or more vias within the layers of the printed circuit board, wherein the one or more vias provide at least a connection path to the planar transformer windings;

a magnetic core around the planar transformer windings;

a field-shaping layer configured to at least shape an electric field of the isolated output generated by the planar transformer windings and the magnetic core, wherein the field-shaping layer is disposed above a soldermask layer on a top surface of the printed circuit board, wherein the field-shaping layer is on a separate vertical plane from the planar transformer windings, and wherein the field-shaping layer is placed on a top layer of the printed circuit board beyond an outer boundary of the magnetic core and the planar transformer windings; and a high-voltage dielectric material between each layer of the printed circuit board.

2. The planar transformer assembly of claim 1, wherein the one or more primary windings are coupled with an input at the connection path to the planar transformer windings provided on the top layer of the printed circuit board.

3. The planar transformer assembly of claim 1, wherein each primary winding of the one or more primary windings and each secondary winding of the one or more secondary windings are separated by at least a polyimide dielectric layer.

4. The planar transformer assembly of claim 1, wherein the top layer of the printed circuit board comprises a soldermask layer, and wherein the field-shaping layer comprises a copper layer.

5. The planar transformer assembly of claim 1, further comprising an air gap in the magnetic core.

6. The planar transformer assembly of claim 1, wherein a spacing between the one or more vias and the magnetic core and the one or more vias and the planar transformer windings reduces the electric field of the isolated output.

7. The planar transformer assembly of claim 2, wherein the input is a photovoltaic source coupled through switching devices.

8. A power converter module, comprising:

one or more ports fed by a source;

one or more quadruple active bridge converters comprising switching devices coupled with the one or more ports, wherein each quadruple active bridge converter of the one or more quadruple active bridge converters is coupled to a planar transformer assembly configured to generate an isolated direct current (DC) output based on the source, and wherein the planar transformer assembly comprises:

planar transformer windings configured to at least generate an isolated output, wherein the planar transformer windings comprise one or more primary windings interleaved with one or more secondary windings embedded on layers of a printed circuit board;

one or more vias within the layers of the printed circuit board, wherein the one or more vias provide at least a connection path to the planar transformer windings;

a magnetic core around the planar transformer windings;

a field-shaping layer configured to at least shape an electric field of the isolated DC output generated by the planar transformer windings and the magnetic core, wherein the field-shaping layer is disposed above a soldermask layer on a top surface of the printed circuit board, wherein the field-shaping layer is on a separate vertical plane from the planar transformer windings, and wherein the field-shaping layer is placed on a top layer of the printed circuit board beyond an outer boundary of the magnetic core and the planar transformer windings; and a high-voltage dielectric material between each layer of the printed circuit board.

9. The power converter module of claim 8, wherein the one or more primary windings are coupled with an input at the connection path to the planar transformer windings provided on the top layer of the printed circuit board.

10. The power converter module of claim 8, wherein each primary winding of the one or more primary windings and each secondary winding of the one or more secondary windings are separated by at least a polyimide dielectric layer.

11. The power converter module of claim 8, wherein the top layer of the printed circuit board comprises a soldermask layer, and wherein the field-shaping layer comprises a copper layer.

12. The power converter module of claim 8, further comprising an air gap in the magnetic core.

13. The power converter module of claim 8, wherein a spacing between the one or more vias and the magnetic core and the one or more vias and the planar transformer windings reduces the electric field of the isolated output.

14. The power converter module of claim 8, wherein the planar transformer assembly is coupled to three or more alternating current (AC) inverters, wherein each AC inverter of the three or more AC inverters is configured to each generate a single-phase AC output at different phases with respect to each other based on the isolated DC output of the planar transformer assembly.

15. The power converter module of claim 14, wherein each AC inverter of the three or more AC inverters is coupled to an AC grid.

16. The power converter module of claim 14, wherein each AC inverter of the three or more AC inverters comprise a controller and/or timing reference configured to synchronize the single-phase AC output of each AC inverter.

17. The power converter module of claim 14, wherein the source comprises a single-phase AC output of a secondary power converter module.

18. The power converter module of claim 8, wherein the source comprises a DC photovoltaic source.

19. A method of manufacturing a planar transformer, comprising:

interleaving a primary winding with one or more secondary windings;

embedding the primary winding and the one or more secondary windings into different layers of a printed circuit board;

coupling the primary winding with vias and the one or more secondary windings with the vias to provide an alternate connection path to the primary winding and the one or more secondary windings within the different layers of the printed circuit board;

coupling the primary winding to a current source wherein the primary winding is coupled to the current source by one or more switching devices;

coupling the one or more secondary windings to one or more current ports wherein the one or more secondary windings are coupled to the one or more current ports by one or more other switching devices;

separating the primary winding and the one or more secondary windings with at least a high voltage dielectric capable of maintaining isolation between each layer of windings;

surrounding the primary winding and the one or more secondary windings with a magnetic core; and integrating a field-shaping layer is disposed above a soldermask layer on a top surface of the printed circuit board, wherein the field-shaping layer is on a separate vertical plane from the primary windings and the one or more secondary windings, and wherein the field-shaping layer is placed on a top layer of the printed circuit board beyond an outer boundary of the magnetic core, the primary windings, and the one or more secondary windings, wherein the field-shaping layer is configured to shape an electric field of an output generated by the primary winding and the one or more secondary windings.

20. The method of manufacturing a planar transformer of claim 19, further comprising coupling three or more alternating current (AC) inverters to the primary winding and the one or more secondary windings, wherein the three or more AC inverters are configured to each generate a single-phase AC output at different phases.

* * * * *